(12) United States Patent
El-Hinnawy et al.

(10) Patent No.: US 11,031,555 B2
(45) Date of Patent: Jun. 8, 2021

(54) POWER HANDLING IMPROVEMENTS FOR PHASE-CHANGE MATERIAL (PCM) RADIO FREQUENCY (RF) SWITCH CIRCUITS

(71) Applicant: Newport Fab, LLC, Newport Beach, CA (US)

(72) Inventors: Nabil El-Hinnawy, Irvine, CA (US); Gregory P. Slovin, Irvine, CA (US); Chris Masse, Irvine, CA (US); Paul D. Hurwitz, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/909,930

(22) Filed: Jun. 23, 2020

(65) Prior Publication Data

US 2020/0335697 A1    Oct. 22, 2020

Related U.S. Application Data

(63) Continuation-in-part of application No. 16/574,471, filed on Sep. 18, 2019, and a continuation-in-part of application No. 16/557,577, filed on Aug. 30, 2019, and a continuation-in-part of application No. 16/546,211, filed on Aug. 20, 2019, now Pat. No. 10,756,268, and a continuation-in-part of application No. 16/420,043, filed on May 22, 2019, and a continuation-in-part of application No. 16/418,130, filed on May 21, 2019, said application No. 16/546,211 is a continuation of application No. 16/103,587, filed on Aug. 14, 2018, now Pat. No.
(Continued)

(51) Int. Cl.
*H01L 45/00* (2006.01)

(52) U.S. Cl.
CPC .......... *H01L 45/1608* (2013.01); *H01L 45/06* (2013.01); *H01L 45/1286* (2013.01); *H01L 45/143* (2013.01); *H01L 45/144* (2013.01); *H01L 45/1675* (2013.01)

(58) Field of Classification Search
None
See application file for complete search history.

(56) References Cited

U.S. PATENT DOCUMENTS 9,368,720 B1    6/2016  Moon
2007/0246766 A1 10/2007  Liu
(Continued)

OTHER PUBLICATIONS

Cellular Antenna Switches for Multimode Applications Based on a Silicon-on-Insulator Technology by Tombak (Year: 2010).*
(Continued)

*Primary Examiner* — Evren Seven
(74) *Attorney, Agent, or Firm* — Farajami & Farajami LLP

(57) ABSTRACT

A radio frequency (RF) switching circuit includes stacked phase-change material (PCM) RF switches. Each of the PCM RF switches includes a PCM, a heating element transverse to the PCM, and first and second heating element contacts. The first heating element contact is coupled to an RF ground, and the second heating element contact may also be coupled to an RF ground. Each of the PCM RF switches can also include first and second PCM contacts. A compensation capacitor can be coupled across the first and second PCM contacts in at least one of the PCM RF switches.

20 Claims, 4 Drawing Sheets

Related U.S. Application Data 10,461,253, said application No. 16/557,577 is a continuation of application No. 16/103,646, filed on Aug. 14, 2018, now Pat. No. 10,475,993, said application No. 16/574,471 is a continuation of application No. 16/103,490, filed on Aug. 14, 2018, now Pat. No. 10,476,001.

(56) References Cited

U.S. PATENT DOCUMENTS

| | | |
|---|---|---|
| 2008/0142777 A1 | 6/2008 | Park |
| 2008/0272355 A1 | 11/2008 | Cho |
| 2008/0291718 A1 | 11/2008 | Liu |
| 2009/0065761 A1 | 3/2009 | Chen |
| 2011/0097825 A1 | 4/2011 | Cheng |
| 2012/0037872 A1 | 2/2012 | Ikarashi |
| 2014/0191181 A1* | 7/2014 | Moon ............... H01L 27/2409 257/4 |
| 2016/0056373 A1 | 2/2016 | Goktepeli |
| 2018/0138894 A1 | 5/2018 | Belot |
| 2019/0165264 A1 | 5/2019 | Wu |
| 2019/0296718 A1 | 9/2019 | Birkbeck et al. |

OTHER PUBLICATIONS

Directly Heated Four-Terminal Phase Change Switches by Wang (Year: 2018).*

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

* cited by examiner

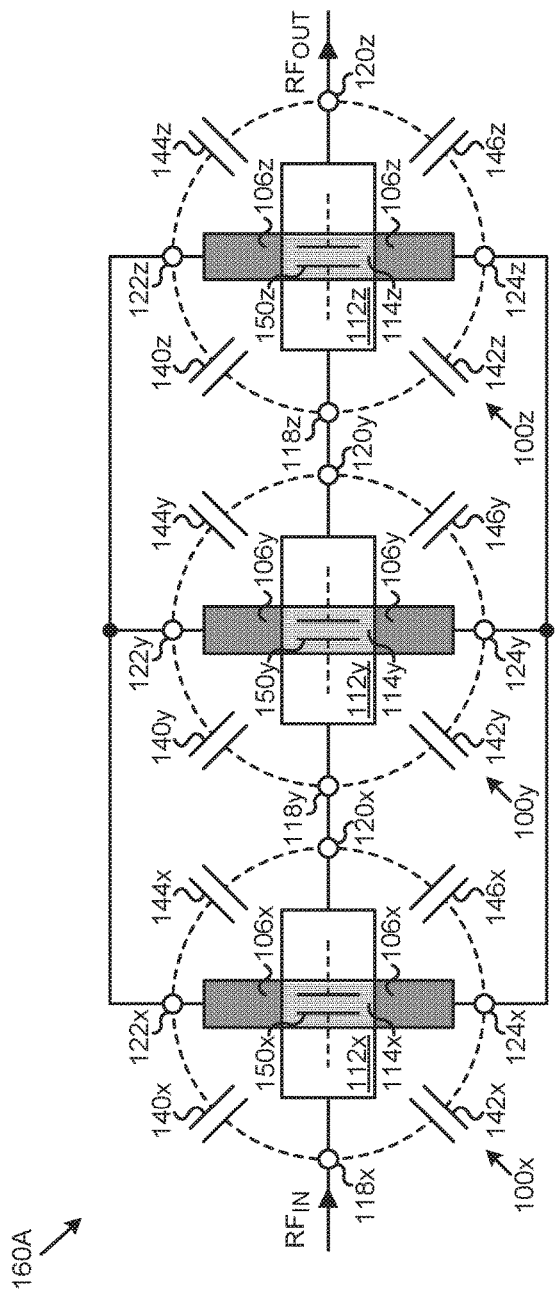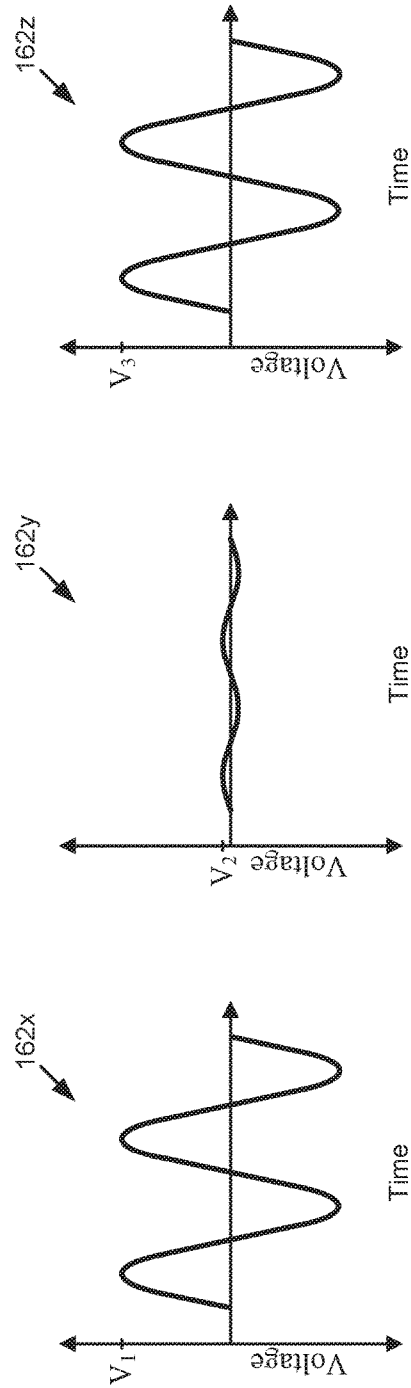
FIG. 2A
FIG. 2B

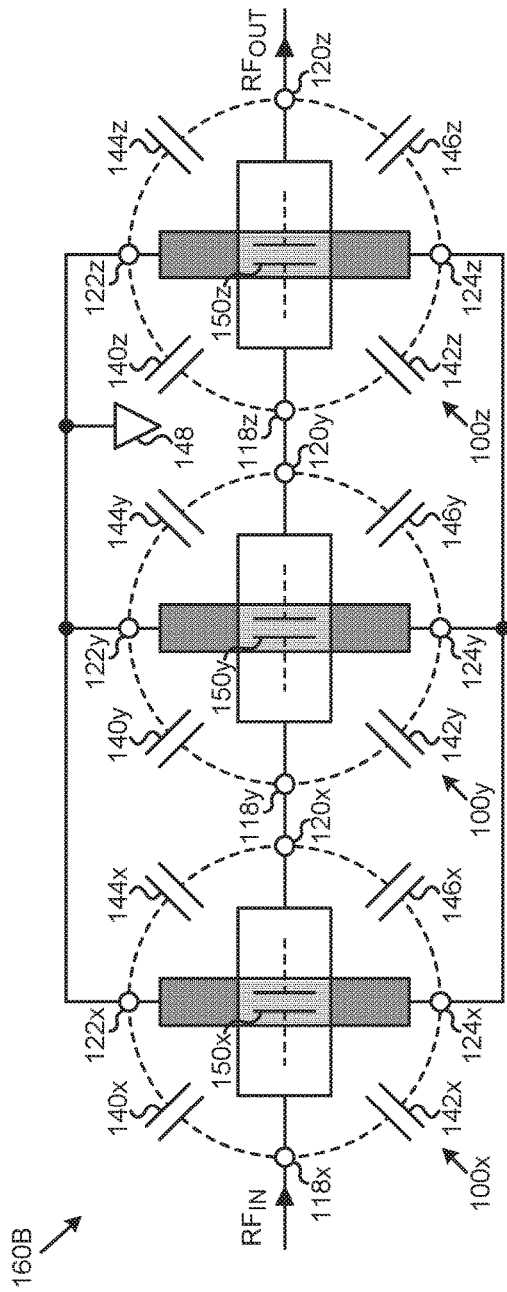
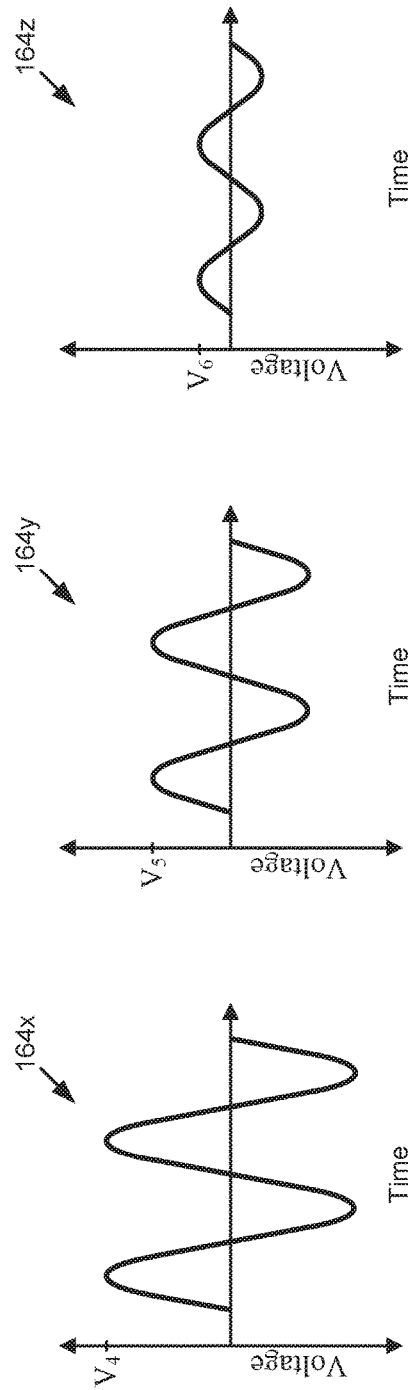
FIG. 3A
FIG. 3B

POWER HANDLING IMPROVEMENTS FOR PHASE-CHANGE MATERIAL (PCM) RADIO FREQUENCY (RF) SWITCH CIRCUITS

CLAIMS OF PRIORITY

The present application is a continuation-in-part of and claims the benefit of and priority to application Ser. No. 16/574,4711 filed on Sep. 18, 2019, titled "Phase-Change Material RF Switch," which is in turn a continuation of and claims the benefit of and priority to application Ser. No. 16/103,490 filed on Aug. 14, 2018, titled "Manufacturing RF Switch Based on Phase-Change Material". The present application is also a continuation-in-part of and claims the benefit of and priority to application Ser. No. 16/546,211 filed on Aug. 20, 2019, titled "High Reliability RF Switch Based on Phase-Change Material," which is in turn a continuation of and claims the benefit of and priority to application Ser. No. 16/103,587 filed on Aug. 14, 2018, titled "Design for High Reliability RF Switch Based on Phase-Change Material". The present application is also a continuation-in-part of and claims the benefit of and priority to application Ser. No. 16/557,577 filed on Aug. 30, 2019, titled "Method of Manufacturing PCM RF Switch," which is in turn a continuation of and claims the benefit of and priority to application Ser. No. 16/103,646 filed on Aug. 14, 2018, titled "PCM RF Switch Fabrication with Subtractively Formed Heater". The present application is further a continuation-in-part of and claims the benefit of and priority to application Ser. No. 16/418,130 filed on May 21, 2019, titled "Radio Frequency (RF) Filtering Using Phase-Change Material (PCM) RF Switches". The present application is further a continuation-in-part of and claims the benefit of and priority to application Ser. No. 16/420,043 filed on May 22, 2019, titled "Radio Frequency (RF) Module Using a Tunable RF Filter with Non-Volatile RF Switches". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

Generally, RF switches can be arranged in a stack in order to improve RF power handling of the switches. But heating elements of PCM RF switches subject them to parasitic capacitances that can significantly impact RF power handling in a stack configuration. The stack may experience different overall power handling depending on how the PCM RF switches connect to each other, to driving devices, and to other circuit elements. Additionally, different PCM RF switches in a stack may have different power handling requirements, depending on where in the stack a particular PCM RF switch is positioned (for example, based on its proximity to an antenna in a receive chain in a wireless transceiver circuit).

Accommodating power handling in PCM RF switches presents different challenges than accommodating power handling in transistor RF switches. For example, there are significant RF performance tradeoffs unique to PCM RF switches due to existence of heating elements in PCM RF switches. Additionally, utilizing a uniform PCM RF switch design is important when fabricating on a large scale and integrating in a variety of chips.

Thus, there is a need in the art for circuits that accommodate improved power handling in stacked PCM RF switches without sacrificing performance parameters and manufacturing conveniences.

SUMMARY

The present disclosure is directed power handling improvements for phase-change material (PCM) radio frequency (RF) switch circuits, substantially as shown and/or described in connection with at least one of the figures, and as set forth in the claims.

BRIEF DESCRIPTION OF THE DRAWINGS

FIG. 2A illustrates a portion of a circuit employing stacked PCM RF switches.

FIG. 2B illustrates exemplary voltage amplitude graphs corresponding to FIG. 2A.

FIG. 3A illustrates a portion of a circuit employing stacked PCM RF switches according to one implementation of the present application.

FIG. 3B illustrates exemplary voltage amplitude graphs corresponding to FIG. 3A according to one implementation of the present application.

DETAILED DESCRIPTION

Figure 1:
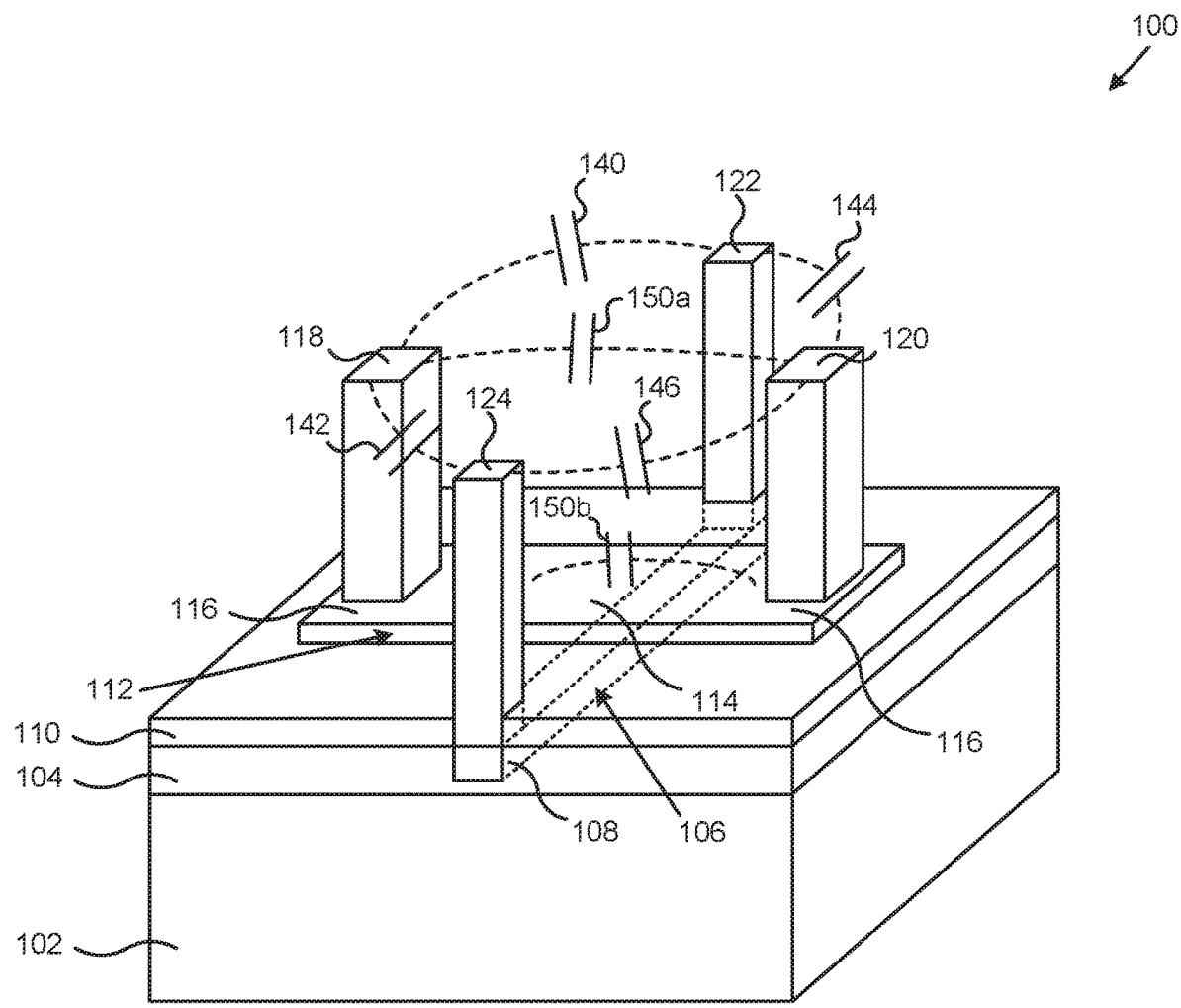
FIG. 1 illustrates a perspective view of a portion of a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of a phase-change material (PCM) radio frequency (RF) switch according to one implementation of the present application. As shown in FIG. 1, PCM RF switch 100 includes substrate 102, lower dielectric 104, heating element 106 having terminal portions 108, thermally conductive and electrically insulating material 110, PCM 112 having active segment 114 and passive segments 116, PCM contacts 118 and 120, heating element contacts 122 and 124, and parasitic capacitors 140, 142, 144, 146, 150*a*, and 150*b*. For purposes of illustration, the perspective view in FIG. 1 shows selected structures of PCM RF switch 100. PCM RF switch 100 may include other structures not shown FIG. 1.

Substrate 102 is situated under lower dielectric 104. In one implementation, substrate 102 is an insulator, such as $SiO_2$. In various implementations, substrate 102 is a silicon (Si), silicon-on-insulator (SOI), sapphire, complementary metal-oxide-semiconductor (CMOS), bipolar CMOS (BiC-MOS), or group substrate. In various implementations, a heat spreader is integrated with substrate 102, or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 100 is situated on top of substrate 102 and below thermally conductive and electrically insulating material 110. As shown in FIG. 1, lower dielectric 104 is also adjacent to sides of heating element 106. Lower dielectric 104 extends along the width of PCM RF switch 100, and is also coplanar with the top of heating element 106. Because PCM RF switch 100 includes lower dielectric 104 on the sides of heating element 106, less heat transfers horizontally (i.e., from the sides) and more heat dissipates vertically from heating element 106 toward active segment 114 of PCM 112. In various implementations, lower dielectric 104 can have a relative width and/or a relative thickness greater or less than shown in FIG. 1. Lower dielectric 104 may comprise a material with thermal conductivity lower than that of thermally conductive and electrically insulating material 110. In various implementations, lower dielectric 104 can comprise silicon oxide ($SiO_2$,) silicon nitride (SiN), or another dielectric.

Heating element 106 in PCM RF switch 100 is situated in lower dielectric 104. Heating element 106 also underlies and approximately defines active segment 114 of PCM 112. Heating element 106 generates a crystallizing pulse or an amorphizing pulse for transforming active segment 114 of PCM 112. Heating element 106 can comprise any material capable of Joule heating. Heating element 106 can be connected to electrodes of a current source (not shown in FIG. 1) that generates a crystallizing pulse or an amorphizing pulse. Preferably, heating element 106 comprises a material that exhibits minimal electromigration or substantially no electro migration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 100 is situated on top of heating element 106 and lower dielectric 104, and under PCM 112 and, in particular, under active segment 114 of PCM 112. Thermally conductive and electrically insulating material 110 ensures efficient heat transfer between heating element 106 and active segment 114 of PCM 112, while impeding electrical signals from leaking out from the path between PCM contacts 118 and 120 to heating element 106 or to other neighboring structures.

Thermally conductive and electrically insulating material 110 can comprise any material with high thermal conductivity and high electrical resistivity. In various implementations, thermally conductive and electrically insulating material 110 can comprise aluminum nitride (AlN), aluminum oxide ($Al_XO_Y$), beryllium oxide ($Be_XO_Y$), silicon carbide (SiC), diamond, or diamond-like carbon. In one implementation, thermally conductive and electrically insulating material 110 can be a nugget that does not extend along the width of PCM RF switch 100. For example, thermally conductive and electrically insulating material 110 can be a nugget approximately aligned with heating element 106.

PCM 112 in PCM RF switch 100 is situated on top of thermally conductive and electrically insulating material 110. PCM 112 includes active segment 114 and passive segments 116. Active segment 114 of PCM 112 approximately overlies heating element 106. Passive segments 118 of PCM 112 extend outward and are transverse to heating element 106, and are situated approximately under PCM contacts 118 and 120. As used herein, "active segment" refers to a segment of PCM that transforms between crystalline and amorphous phases, for example, in response to a crystallizing or an amorphizing heat pulse, whereas "passive segment" refers to a segment of PCM that does not make such transformation and maintains a crystalline phase (i.e., maintains a conductive state). With proper heat pulses and heat dissipation, active segment 114 of PCM 112 can transform between crystalline and amorphous phases, allowing PCM RF switch 100 to switch between ON and OFF states respectively.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 extends outwards and is transverse to PCM 112. Heating element 106 is illustrated with dashed lines as seen through various structures of PCM RF switch 100. Current flowing in heating element 106 flows substantially under active segment 114 of PCM 112.

PCM contacts 118 and 120 in PCM RF switch 100 are connected to passive segments 116 of PCM 112. Similarly, heating element contacts 122 and 124 are connected to terminal segments 108 of heating element 106. PCM contacts 118 and 120 provide RF signals to and from PCM 112. Heating element contacts 122 and 124 provide power to heating element 106 for generating a crystallizing pulse or an amorphizing pulse. PCM contacts 118 and 120 and heating element contacts 122 and 124 can extend through various interlayer metal levels (not shown in FIG. 1). In various implementations, PCM contacts 118 and 120 and heating element contacts 122 and 124 can comprise tungsten (W), copper (Cu), or aluminum (Al).

In one implementation, in order to ensure uniform contact between PCM 112 and PCM contacts 118 and 120, PCM contacts 118 and 120 can extend through a contact uniformity support layer (not shown in FIG. 1) situated on top of PCM 112, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM RF switch 100 has low insertion loss and is able to provide several advantages. First, PCM 112 in the crystalline state has low resistivity, while PCM 112 in the amorphous state has high resistivity. In various implementations, PCM 112 may have an area of approximately ten square microns (10 μm²), and the OFF state resistance ($R_{OFF}$) of PCM RF switch 100 can range from approximately ten kilo-Ohms to approximately one mega-Ohm (10 kΩ-1 MΩ), while the ON state resistance ($R_{ON}$) of PCM RF switch 100 can be approximately one Ohm (1Ω) or less. In contrast, a conventional switch may need a channel area of approximately four hundred square microns (400 μm²) to achieve the same $R_{ON}$.

Second, where an optional contact uniformity support layer is utilized as described above, PCM 112 will remain substantially intact, and PCM contacts 118 and 120 can uniformly contact passive segments 116 of PCM 112. Because the $R_{ON}$ of PCM RF switch 100 in FIG. 1 depends heavily on the uniformity of contacts made with PCM 112, the $R_{ON}$ will be significantly lower when an optional contact uniformity support layer is used.

Third, because PCM RF switch 100 includes lower dielectric 104 adjacent to sides of heating element 106, more heat dissipates vertically from heating element 106. Lower dielectric 104 under heating element 106 also performs as a heat valve that biases vertical heat dissipation from heating element 106 toward active segment 114 of PCM 112, rather than toward substrate 102, enabling PCM RF switch 100 to transition between OFF and ON states using even lower power and/or even quicker pulses. Thus, passive segments 116 are subjected to less thermal cycling consequences, and can be spaced more closely to decrease $R_{ON}$, as disclosed in U.S. patent application Ser. No. 16/103,587 filed on Aug. 14, 2018, titled "Design for High Reliability RF Switch Based on Phase-Change Material." The disclosure and content of the above-identified application are incorporated fully by reference into the present application.

Fourth, PCM contacts 118 and 120 can be formed crosswise to heater contacts 122 and 124, further reducing parasitic capacitive coupling. This reduction in parasitic capacitance values of PCM RF switch 100 is disclosed and described in U.S. patent application Ser. No. 16/161,960 filed on Oct. 16, 2018, titled "Phase-Change Material (PCM) Radio Frequency (RF) Switch with Reduced Parasitic Capacitance." The disclosure and content of the above-identified application are incorporated fully by reference into the present application.

In addition to having low insertion loss and the other advantages described above, PCM RF switch 100 is advantageously non-volatile. That is, active segment 114 of PCM 112 maintains its crystalline (ON state) or amorphous phase (OFF state) even when power is not supplied to heating element 106. PCM RF switch 100 requires less power than conventional switches when remaining in an ON state. Also, PCM RF switch 100 is resilient to voltage fluctuations in its programming, making PCM RF switch 100 particularly applicable in antenna tuners and other circuits which might experience large voltage fluctuations.

Notably, various parasitic capacitors, such as parasitic capacitors 140, 142, 144, 146, 150a, and 150b are formed in PCM RF switch 100. Parasitic capacitor 140 is formed between PCM contact 118 and heating element contact 122, while parasitic capacitor 142 is formed between PCM contact 118 and heating element contact 124. Parasitic capacitor 144 is formed between PCM contact 120 and heating element contact 122, while parasitic capacitor 146 is formed between PCM contact 120 and heating element contact 124. Parasitic capacitors 140, 142, 144, and 146 provide PCM contacts 118 and 120 electrical paths through heating element contacts 122 and 124. In one implementation, the capacitance value of parasitic capacitor 140, 142, 144, or 146 is approximately between one fifth a femto-Farad and two femto-Farads (0.2 fF-2 fF).

Parasitic capacitor 150a is formed between PCM contact 118 and PCM contact 120, and parasitic capacitor 150b is formed between passive segments 116 of PCM 112. Parasitic capacitors 150a and 150b provide electrical paths through PCM contacts 118 and 120 even when active segment 114 of PCM 112 is in an amorphous phase (i.e., even when PCM RF switch 100 is in an OFF state). In one implementation, the capacitance value of parasitic capacitor 150a or 150b is approximately between five femto-Farads and fifteen femto-Farads (5 fF-15 fF).

FIG. 2A illustrates a portion of a circuit employing stacked PCM RF switches. Circuit 160A in FIG. 2A includes RF input ($RF_{IN}$), three PCM RF switches 100x, 100y, and 100z, and RF output ($RF_{OUT}$). Circuit 160A can be situated in an RF receive chain. For example, $RF_{IN}$ and $RF_{OUT}$ can be coupled between an antenna and a low noise amplifier (LNA). Circuit 160A can also be situated in an RF transmit chain. For example, $RF_{IN}$ and $RF_{OUT}$ can be coupled between a power amplifier and an antenna.

Each PCM RF switch 100x, 100y, and 100z in FIG. 2A generally corresponds to PCM RF switch 100 in FIG. 1. Each heating element 106x, 106y, and 106z corresponds to heating element 106 (shown in FIG. 1). Each PCM 112x, 112y, and 112z, having active segments 114x, 114y, and 114z corresponds to PCM 112 having active segment 114 (shown in FIG. 1). Each PCM contact 118x, 118y, and 118z corresponds to PCM contact 118 (shown in FIG. 1). Likewise, each PCM contact 120x, 120y, and 120z corresponds to PCM contact 120 (shown in FIG. 1). Each heating element contact 122x, 122y, and 122z corresponds to heating element contact 122 (shown in FIG. 1). Likewise, each heating element contact 124x, 124y, and 124z corresponds to heating element contact 124 (shown in FIG. 1). Each parasitic capacitor 140x, 140y, and 140z corresponds to parasitic capacitor 140 (shown in FIG. 1) which exist between PCM contact 118 and heating element contact 122. Likewise, each parasitic capacitor 142x, 142y, and 142z corresponds to parasitic capacitor 142 (shown in FIG. 1) which exist between PCM contact 118 and heating element contact 124. Each parasitic capacitor 144x, 144y, and 144z corresponds to parasitic capacitor 144 (shown in FIG. 1) which exist between PCM contact 120 and heating element contact 122.

Likewise, each parasitic capacitor 146x, 146y, and 146z corresponds to parasitic capacitor 146 (shown in FIG. 1) which exist between PCM contact 120 and heating element contact 124. Each (parasitic capacitor 150x, 150y, and 150z corresponds to a combination of parasitic capacitors 150a and 150b (shown in FIG. 1) which exist between PCM contact 118 and PCM contact 120. PCM RF switches 100x, 100y, and 100z may be manufactured substantially identically in terms of materials and dimensions.

PCM RF switches 100x, 100y, and 100z in circuit 160A in FIG. 2A are shown in a "stacked" configuration. In the present example, PCM RF switch 100x is shown as most proximate to (i.e. closest to) $RF_{IN}$, while PCM RF switch 100z is shown as least proximate to (i.e. farthest from) $RF_{IN}$. PCM contact 120x of PCM RF switch 100x is electrically connected to PCM contact 118y of PCM RF switch 100y. Likewise, PCM contact 120y of PCM RF switch 100y is electrically connected to PCM contact 118z of PCM RF switch 100z. Thus, PCM RF switches 100x, 100y, and 100z are in a cascade or a stacked configuration. In various implementations, circuit 160A can include more or fewer stacked PCM RF switches than shown in FIG. 2A.

When PCM RF switches 100x, 100y, and 100z are in their ON states, circuit 160A can provide RF signals from $RF_{IN}$ to $RF_{OUT}$, such as to an LNA, with little or substantially no voltage drop. Additional circuitry not shown in FIG. 2A can also be connected to $RF_{IN}$ and $RF_{OUT}$. For example, in an RF receive chain, $RF_{OUT}$ can be connected to a filter or down-converting mixer, which is in turn coupled to an LNA. As another example, in an RF transmit chain, $RF_{IN}$ can be connected to a power amplifier or upconverting mixer, and $RF_{OUT}$ can be connected to an antenna or filter.

By stacking PCM RF switches 100x, 100y, and 100z as shown in FIG. 2A, the overall OFF state RF voltage handling capability for circuit 160A should theoretically increase. For example, if only PCM RF switch 100x were used, circuit 160A may have an overall OFF state RF voltage handling capability of five volts (5 V). By stacking three PCM RF switches 100x, 100y, and 100z, circuit 160A may theoretically expect an overall OFF state RF voltage handling capability of fifteen volts (15 V).

However, in practice, RF voltage may be non-uniformly distributed between PCM RF switches 100x, 100y, and 100z. In particular, in the implementation shown in FIG. 2A, PCM RF switch 100y may fail to contribute to increased voltage handling. In FIG. 2A, PCM RF switches 100x, 100y, and 100z are shown in OFF states (i.e., active segments 114x, 114y, and 114z of PCMs 112x, 112y, and 112z are in amorphous phases). Notably, heating element contacts 124x, 124y, and 124z are coupled to each other and are electrically floating. Heating element contacts 124x, 124y, and 124z may be made electrically floating, for example, when they are not driven by a pulse generator (not shown) after circuit 160A switches from an ON state to an OFF state. As also shown in FIG. 2A, heating element contacts 122x, 122y, and 122z are coupled to each other and are also electrically floating. In one implementation, heating element contacts 122x, 122y, and 122z are electrically floating but not coupled to each other.

When heating element contacts 124x, 124y, and 124z are electrically floating as shown in FIG. 2A, the effective impedance through parasitic capacitors 140x, 142x, 144x, 146x, 140y, 142y, 144y, 146y, 140z, 142z, 144z, and 146z may be significantly less than the effective impedance through parasitic capacitors 150x, 150y, and 150z. Thus, undesirable electrical paths from $RF_{IN}$ to $RF_{OUT}$ result from capacitive coupling provided by heating element contacts 122 and 124 (shown in FIG. 1), i.e. through parasitic capacitors 140x, 142x, 144x, 146x, 140y, 142y, 144y, 146y, 140z, 142z, 144z, and 146z. As a result, RF voltage in circuit 160A will be distributed primarily across PCM RF switches 100x and 100z; and barely any voltage will be distributed across PCM RF switch 100y.

FIG. 2B illustrates exemplary voltage amplitude graphs corresponding to FIG. 2A. Graphs 162x, 162y, and 162z illustrate exemplary voltage amplitudes versus time for respective PCM RF switches 100x, 100y, and 100z in FIG. 2A. Voltage graph 162x represents the voltage measured across PCM contacts 118x and 120x of PCM RF switch 100x. Likewise, voltage graph 162y represents the voltage measured across PCM contacts 118y and 120y of PCM RF switch 100y, and voltage graph 162z represents the voltage measured across PCM contacts 118z and 120z of PCM RF switch 100z. Voltage graphs 162x, 162y, and 162z illustrate sinusoidal RF voltages with respective amplitudes of $V_1$, $V_2$, and $V_3$, in response to a sinusoidal RF voltage provided by $RF_{IN}$.

As shown by voltage graphs 162x, 162y, and 162z, RF voltage across circuit 160A is distributed primarily across PCM RF switches 100x and 100z; and barely any RF voltage is distributed across PCM RF switch 100y. In the present implementation, voltages $V_1$ and $V_3$ are approximately equal, and voltage $V_2$ is approximately zero. In one example, the RF voltage provided by $RF_{IN}$ may be 15 volts (15 V), voltages $V_1$ and $V_3$ across PCM RF switches 100x and 100z may each be approximately seven and a half volts (7.5 V), while voltage $V_2$ across PCM RF switch 100y may be approximately zero volts or approximately several hundred millivolts.

In this example, if PCM RF switches 100x, 100y, and 100z were designed such that each had a breakdown voltage of five volts (5 V), the seven and a half volts (7.5 V) voltage drop across PCM RF switches 100x and 100z would exceed their respective voltage handling capabilities, and circuit 160A would experience failure. Even if PCM RF switches 100x, 100y, and 100z were designed with higher breakdown voltages, PCM RF switch 100y still fails to contribute any significant increased voltage handling to circuit 160A. In a similar fashion, if circuit 160A employed four stacked PCM RF switches, the middle two PCM RF switches would fail to contribute increased voltage handling. In an ideal version of circuit 160A, parasitic capacitors 140x, 142x, 144x, 146x, 140y, 142y, 144y, 146y, 140z, 142z, 144z, and 146z would not exist, and RF voltage would be more uniformly distributed to all PCM RF switches 100x, 100y, and 100z in circuit 160A.

FIG. 3A illustrates a portion of a circuit employing stacked PCM RF switches according to one implementation of the present application. Except for differences noted below, circuit 160B in FIG. 3A generally corresponds to circuit 160A in FIG. 2A, and may have any implementations and advantages described above. As shown in FIG. 3A, in circuit 160B, heating element contacts 124x, 124y, and 124z are coupled to RF ground 148. It is noted that RF ground 148 refers to a node substantially lacking of alternating current (AC) and RF ground 148 is not required to be a direct current (DC) ground. For example, RF ground 148 may have approximately zero AC voltage, and may have either zero or nonzero steady DC voltage. Thus, "RF ground" as referred to in the present application includes either or both a DC ground (i.e., zero volts DC), and an AC ground, which has a constant DC voltage other than zero volts. In one implementation, RF ground 148 may not be common. For example, heating element contacts 124x, 124y, and 124z may be coupled to different nodes that are separate RF grounds. In circuit 160B, heating element contacts 122x, 122y, and 122z are also coupled to RF ground 148. In other implementations, heating element contacts 122x, 122y, and 122z are not coupled to RF ground 148. For example, heating element contacts 122x, 122y, and 122z may remain coupled to a pulse generator that is no longer pulsing after circuit 160B switches from an ON state to an OFF state.

In circuit 160B, parasitic capacitors 140x, 142x, 144x, 146x, 140y, 142y, 144y, 146y, 140z, 142z, 144z, and 146z provide an electrical path to ground 148 for PCM contacts 118x, 120x, 118y, 120y, 118z, and 120z. When parasitic capacitors 140x, 142x, 144x, 146x, 140y, 142y, 144y, 146y, 140z, 142z, 144z, and 146z are small relative to parasitic capacitors 150x, 150y, and 150z, the RF voltage drop is iteratively less across each PCM RF switch in the stack. For example, the RF voltage drop across PCM RF switch 100y is less than the RF voltage drop across PCM RF switch 100x, due to parasitic capacitors 140x, 142x, 144x, 146x, 140y, and 142y diverting some of the charge coupled by parasitic capacitor 150x. Likewise, the RF voltage drop across PCM RF switch 100z is less than the RF voltage drop across PCM RF switch 100y, due to of parasitic capacitors 144y, 146y, 140z, 142z, 144z, and 146z diverting some of the charge coupled by parasitic capacitor 150y. Thus, when PCM RF switches 100x, 100y, and 100z are in their OFF stales, the RF voltage across parasitic capacitor 150y is less than the RF voltage across parasitic capacitor 150x, and the RF voltage across parasitic capacitor 150z is less than the RF voltage across parasitic 150y. Advantageously, coupling heating element contacts 124x, 124y, and 124z to RF ground 148 as shown in FIG. 3A results in PCM RF switch 100y contributing increased voltage handling to circuit 160B.

FIG. 3B illustrates exemplary voltage amplitude graphs corresponding to FIG. 3A according to one implementation of the present application. Graphs 164x, 164y, and 164z illustrate exemplary voltages versus time for respective PCM RF switches 100x, 100y, and 100z in FIG. 3A. Voltage graphs 164x, 164y, and 164z illustrate RF signals with respective voltage amplitudes of $V_4$, $V_5$, and $V_6$, in response to RF signals provided by $RF_{IN}$. As shown by graphs 164x, 164y, and 164z, RF voltage distribution in circuit 160B is iteratively less across each PCM RF switch in the stack. In one example, the RF voltage at $RF_{IN}$ may be 15 volts (15 V), voltage $V_4$ across PCM RF switch 100x may be approximately eight volts (8 V), voltage $V_5$ across PCM RF switch 100y may be approximately five volts (5 V), and voltage $V_6$ across PCM RF switch 100z may be approximately two volts (2 V). Significantly, unlike in FIG. 2A where PCM RF switch 100y failed to contribute to increased voltage handling in circuit 160A, in the present example of FIG. 3A, PCM RF switch 100y contributes to increased voltage handling in circuit 160B. In a similar fashion, if circuit 160B employed four stacked PCM RF switches, the middle two PCM RF switches may both contribute increased voltage handling (albeit with the second of the middle two PCM RF switches contributing less, as described above).

Figure 4A:
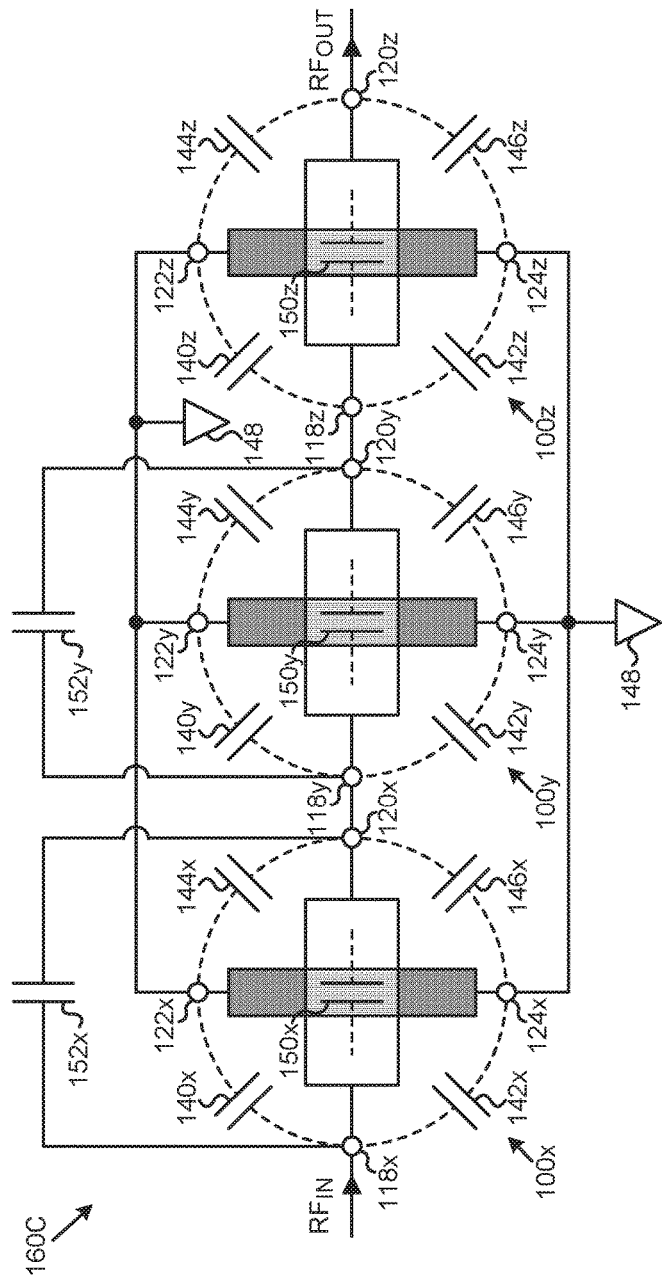
FIG. 4A illustrates a portion of a circuit employing stacked PCM RF switches according to one implementation of the present application.

FIG. 4A illustrates a portion of a circuit employing stacked PCM RF switches according to one implementation of the present application. Except for differences noted below, circuit 160C in FIG. 4A generally corresponds to circuit 160B in FIG. 3A, and may have any implementations and advantages described above. As shown in FIG. 4A, in circuit 160C, compensation capacitor 152x is coupled across PCM contacts 118x and 120x of PCM RF switch 100x. Likewise, compensation capacitor 152y is coupled across PCM contacts 118y and 120y of PCM RF switch 100y.

Compensation capacitors 152x and 152y may be any capacitor known in the art. For example, compensation capacitors 152x and 152y may be metal-oxide-metal (MOM) capacitors. As another example, compensation capacitors 152x and 152y may be metal-insulator-metal (MIM) capacitors having top metals formed within an interlayer dielectric where conventionally no metal exists. Compensation capacitors 152x and 152y may be monolithically integrated with PCM RF switches 100x, 100y, and 100z.

In circuit 160C, compensation capacitors 152x and 152y compensate for parasitic capacitors 140x, 142x, 144x, 146x, 140y, 142y, 144y, 146y, 140z, 142z, 144z, and 146z and also prevent from diverting to ground RF signals provided at $RF_{IN}$, and advantageously result in RF voltage being more uniformly distributed across each stacked PCM RF switch in circuit 160C. For example, compensation capacitor 152x coupled across PCM contacts 118x and 120x is in parallel with parasitic capacitor 150x, effectively increasing the capacitance value of parasitic capacitor 150x. In effect, the ratio of parasitic capacitor 150x to parasitic capacitors 140x, 142x, 144x, and 146x increases. Likewise, compensation capacitor 152y effectively increases the ratio of parasitic capacitor 150y to (parasitic capacitors 140y, 142y, 144y, and 146y. As such, despite parasitic capacitors 140x, 142x, 144x, 146x, 140y, 142y, 144y, 146y, 140z, 142z, 144z, and 146z diverting some of the charge coupled by parasitic capacitors 150x, 150y, and 150z, RF voltage would be more uniformly distributed across each stacked PCM RF switch in circuit 160C.

In order to substantially uniformly distribute RF voltage across each PCM RF switch in the stack, the values of compensation capacitors 152x and 152y are designed according to the relative RF power that is expected to be distributed to each stacked PCM RF switch in circuit 160C based on the proximity of each PCM RF switch to $RF_{IN}$. For example, where a higher RF voltage would otherwise be provided across the PCM RF switches closer to $RF_{IN}$ relative to the PCM RF switches farther from $RF_{IN}$ (as in FIG. 3A), the compensation capacitors closer to $RF_{IN}$ are designed to create higher effective capacitance across their corresponding PCM contacts relative to the compensation capacitors farther from $RF_{IN}$ which are designed to create lower effective capacitance across their corresponding PCM contacts.

For example, in circuit 160C of FIG. 4A, compensation capacitor 152x that is closest to $RF_{IN}$ would be designed to create higher effective capacitance across PCM contacts 118x and 120x of PCM RF switch 100x, while compensation capacitor 152y that is further from $RF_{LP}$ would be designed to create lower effective capacitance across PCM contacts 118y and 120y of PCM RF switch 100x. In one example, the capacitance value of compensation capacitor 152x may be about forty femto-Farad (40 fF), while the capacitance value of compensation capacitor 152y may be about seventeen femto-Farad (17 fF).

Figure 4B:
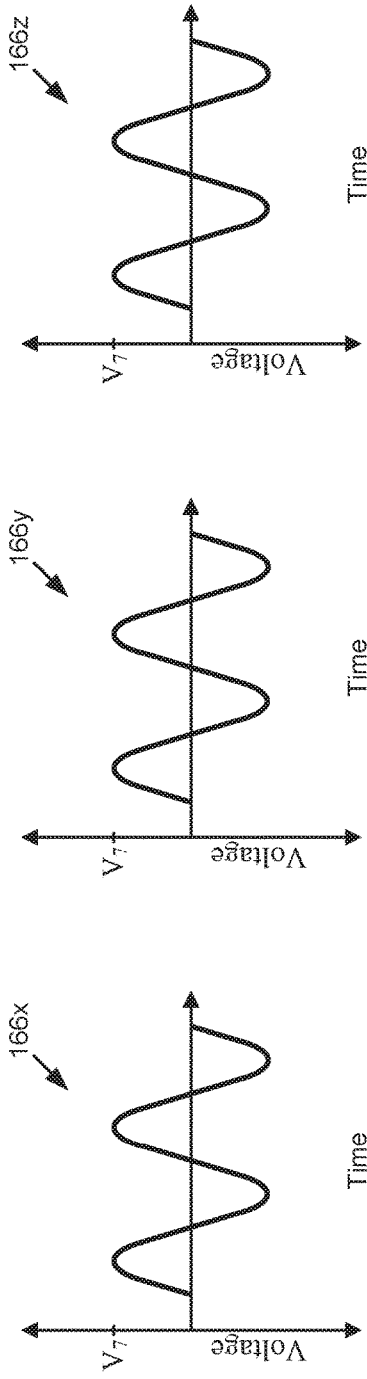
FIG. 4B illustrates exemplary voltage amplitude graphs corresponding to FIG. 4A according to one implementation of the present application.

FIG. 4B Illustrates exemplary voltage amplitude graphs corresponding to FIG. 4A according to one implementation of the present application. Graphs 166x, 166y, and 166z illustrate exemplary voltage amplitudes versus time for respective PCM RF switches 100x, 100y, and 100z in FIG. 4A. Voltage graphs 166x, 166y, and 166z illustrate RF signals with voltage amplitudes $V_7$ across each PCM RF switch 100x, 100y, and 100z in response to an RF signal provided at $RF_{IN}$. As shown by voltage graphs 164x, 164y, and 164z, RF voltage in circuit 160C is substantially uniformly distributed across each PCM RF switch in the stack. That is, each of PCM RF switches 100x, 100y, and 100z experiences voltage $V_7$. In one example, the RF voltage provided by $RF_{IN}$ may be 15 volts (15 V), and voltage $V_7$ across each of PCM RF switches 100x, 100y, and 100z may be approximately five volts (5 V).

Significantly, unlike in FIG. 2A where PCM RF switch 100y failed to contribute increased voltage handling to circuit 160A, in the present example of FIG. 4A, PCM RF switch 100y contributes increased voltage handling to circuit 160C. It is noted that stacking three PCM RF switches 100x, 100y, and 100z as shown in FIG. 2A can provide increased overall power handling compared to a circuit employing only one PCM RF switch. However, coupling heating element contacts 124x, 124y, and 124z to RF ground 148, and coupling compensation capacitors 152x and 152y across respective pairs of PCM contacts 118x and 120x, and 118y and 120y as shown in circuit 160C of FIG. 4A can provide increased overall power handling that is approximately between two and three times greater than that provided by circuit 160A in FIG. 2A. This increased relative power handling further scales when additional PCM RF switches are stacked. For example, if circuit 160C utilized four PCM RF switches (instead of the three shown in FIG. 4A), circuit 160C could provide increased overall power handling approximately four times greater than that provided by circuit 160A in FIG. 2A. As another example, if circuit 160C utilized five PCM RF switches (instead of the three shown in FIG. 4A), circuit 160C could provide increased overall power handling more than six times greater than that provided by circuit 160A in FIG. 2A.

Moreover, this solution more uniformly distributes RF voltage across PCM RF switches 100x, 100y, and 100z. If RF voltage were non-uniformly distributed across PCM RF switches 100x, 100y, and 100z (as in circuit 160A in FIG. 2A), a conventional solution may design all PCM RF switches 100x, 100y, and 100z such that each has a breakdown voltage equal to or greater than the highest voltage drop across any individual PCM RF switch. Continuing with the above example, if voltages $V_1$ and $V_3$ in FIG. 1B across PCM RF switches 100x and 100z were each be approximately seven and a half volts (7.5 V), while voltage $V_2$ in FIG. 1B across PCM RF switch 100y were approximately several hundred millivolts, PCM RF switches 100x, 100y, and 100z in FIG. 1A need be designed such that each has breakdown voltage of eight volts (8 V). However, this results in PCM RF switch 100y having a breakdown voltage greater than the voltage drop that switch will experience during operation. That is, the eight volts (8 V) breakdown voltage would be greater than the several hundred millivolts drop across PCM RF switch 100y. Because increased breakdown voltage trades off small signal RF performance, it is disadvantageous to over-design PCM RF switches such that their breakdown voltages are greater than their respective voltage drops.

In circuit 160C in FIG. 4A, because RF voltage is more uniformly distributed across PCM RF switches 100x, 100y, and 100z, each of PCM RF switches 100x, 100y, and 100z can be designed identically and with the same or substantially the same breakdown voltage, while avoiding over-designing PCM RF switches 100x, 100y, and 100z by trading off their critical performance characteristics. In particular, in addition to the increased power handling described above, circuit 160C exhibits lower harmonic distortion and lower intermodulation distortion (IMD).

Because RF voltage is more uniformly distributed, PCM RF switches 100x, 100y, and 100z can also avoid failures. For example, PCM RF switches 100x, 100y, and 100z can each be designed with a breakdown voltage greater than the highest expected voltage drop across any individual switch, in order to provide a margin of error and account for voltage fluctuations. In circuit 600 in FIG. 4A, because RF voltage is more uniformly distributed across PCM RF switches 100x, 100y, and 100z, voltage fluctuations are less likely to cause PCM RF switches 100x, 100y, and 100z to exceed their voltage handling capability, and circuit 160A is less prone to failure.

In the implementation of FIG. 4A, N−1 compensation capacitors are utilized, where N represents the number of stacked PCM RF switches in circuit 160C, and no compensation capacitor is utilized across the last stacked PCM RF switch 100z. This enables RF voltage to be more uniformly distributed across each PCM RF switch, while minimizing the number of compensation capacitors utilized. In various implementations, more or fewer compensation capacitors may be utilized. For example, a compensation capacitor may be coupled across PCM contacts 118z and 120z of PCM RF switch 100z. As another example, circuit 160C may utilize compensation capacitor 152x without compensation capacitor 152y. In this example, RF voltage may be more uniformly distributed across PCM RF switches 100x and 100y, while less RF voltage is distributed across PCM RF switch 100z. Such an implementation would still provide improvements in power handling and small signal RF performance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A circuit comprising:
a plurality of stacked phase-change material (PCM) radio frequency (RF) switches;
a PCM RF switch in said plurality of stacked PCM RF switches including:
a PCM;
a heating element transverse to said PCM;
first and second heating element contacts, wherein said first heating element contact is electrically coupled to an RF ground when said PCM RF switch is in an OFF state.

2. The circuit of claim 1, wherein said second heating element contact is electrically coupled to an RF ground when said PCM RF switch is in an OFF state.

3. The circuit of claim 1, wherein said heating element approximately underlies an active segment of said PCM.

4. The circuit of claim 1, wherein said PCM comprises material selected from the group consisting of germanium telluride ($Ge_xTe_y$), germanium antimony telluride ($Ge_xSb_yTe_z$), germanium selenide ($Ge_xSe_y$), and a chalcogenide glass.

5. The circuit of claim 1, wherein said circuit is situated in an RF receive chain between an antenna and a low noise amplifier (LNA).

6. The circuit of claim 1, wherein said circuit is situated in an RF transmit chain between a power amplifier and an antenna.

7. The circuit of claim 1, wherein said PCM RF switch further includes PCM contacts situated on passive segments of said PCM.

8. The circuit of claim 1, wherein said PCM RF switch further includes a thermally conductive and electrically insulating material situated over said heating element.

9. The circuit of claim 8, wherein said thermally conductive and electrically insulating material is selected from the group consisting of silicon carbide ($Si_xC_y$), aluminum nitride ($Al_xN_y$), aluminum oxide ($Al_xO_y$), beryllium oxide ($Be_xO_y$), diamond, and diamond-like carbon.

10. The circuit of claim 1, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

11. A circuit comprising:
a plurality of stacked phase-change material (PCM) radio frequency (RF) switches;
each of said PCM RF switches including:
a PCM;
a heating element transverse to said PCM;

first and second PCM contacts;

first and second heating element contacts, wherein said first heating element contact is coupled to an RF ground;

a compensation capacitor coupled across said first and second PCM contacts in at least one of said PCM RF switches.

12. The circuit of claim 11, wherein said second heating element contact is coupled to said RF ground.

13. The circuit of claim 11, wherein said heating element approximately underlies an active segment of said PCM.

14. The circuit of claim 11, wherein said PCM comprises material selected from the group consisting of germanium telluride ($Ge_X Te_Y$), germanium antimony telluride ($Ge_X Sb_Y Te_Z$), germanium selenide ($Ge_X Se_Y$), and a chalcogenide glass.

15. The circuit of claim 11, wherein said circuit is situated in an RF receive chain between an antenna and a low noise amplifier (LNA).

16. The circuit of claim 11, wherein said circuit is situated in an RF transmit chain between a power amplifier and an antenna.

17. The circuit of claim 11, wherein said first and second PCM contacts are situated on passive segments of said PCM.

18. The circuit of claim 11, wherein each of said PCM RF switches further includes a thermally conductive and electrically insulating material situated over said heating element.

19. The circuit of claim 18, wherein said thermally conductive and electrically insulating material is selected from the group consisting of silicon carbide ($Si_X C_Y$), aluminum nitride ($Al_X N_Y$), aluminum oxide ($Al_X O_Y$), beryllium oxide ($Be_X O_Y$), diamond, and diamond-like carbon.

20. The circuit of claim 11, wherein said heating element comprises a material selected from the group consisting of tungsten (W), molybdenum (Mo), titanium (Ti), titanium tungsten (TiW), titanium nitride (TiN), tantalum (Ta), tantalum nitride (TaN), nickel chromium (NiCr), and nickel chromium silicon (NiCrSi).

* * * * *